US008938654B2

(12) United States Patent
Sokolov et al.

(10) Patent No.: US 8,938,654 B2
(45) Date of Patent: Jan. 20, 2015

(54) PROGRAMMABLE CIRCUIT FOR HIGH SPEED COMPUTATION OF THE INTERLEAVER TABLES FOR MULTIPLE WIRELESS STANDARDS

(75) Inventors: Andrey P. Sokolov, Moscow (RU); Elyar E. Gasanov, Moscow (RU); Ilya V. Neznanov, Moscow (RU); Pavel A. Aliseychik, Moscow (RU); Pavel A. Panteleev, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 704 days.

(21) Appl. No.: 12/894,458

(22) Filed: Sep. 30, 2010

(65) Prior Publication Data

US 2011/0239079 A1 Sep. 29, 2011

(30) Foreign Application Priority Data

Mar. 24, 2010 (RU) ................................ 2010111027

(51) Int. Cl.
*H03M 13/27* (2006.01)
*H03M 13/00* (2006.01)
*H04L 1/00* (2006.01)

(52) U.S. Cl.
CPC ...... *H03M 13/2771* (2013.01); *H03M 13/2767* (2013.01); *H03M 13/6519* (2013.01); *H04L 1/0066* (2013.01); *H04L 1/0071* (2013.01); *H04L 1/005* (2013.01)
USPC ........... 714/755; 714/702; 714/756; 714/762; 714/775; 714/780

(58) Field of Classification Search
USPC ....................................................... 714/702
See application file for complete search history.

(56) References Cited

U.S. PATENT DOCUMENTS

| 4,926,355 | A | 5/1990 | Boreland ....................... 364/200 |
|---|---|---|---|
| 4,942,525 | A | 7/1990 | Shintani et al. ............... 364/200 |
| 6,052,773 | A | 4/2000 | DeHon et al. ................... 712/43 |
| 6,353,640 | B1 | 3/2002 | Hessel et al. .................. 375/262 |
| 6,721,581 | B1 | 4/2004 | Subramanian ............. 455/575.1 |
| 7,230,978 | B2 | 6/2007 | Bitterlich et al. ............. 375/219 |
| 7,254,649 | B2 | 8/2007 | Subramanian et al. ........... 710/8 |

(Continued)

FOREIGN PATENT DOCUMENTS

WO    WO 2009150612 A1 * 12/2009    ............ H03M 13/27

OTHER PUBLICATIONS

Asghar, R.; Liu, D., "Dual standard re-configurable hardware interleaver for turbo decoding," Wireless Pervasive Computing, 2008. ISWPC 2008. 3rd International Symposium on , vol., no., pp. 768,772, May 7-9, 2008, doi:10.1109/ISWPC.2008.4556314.*

(Continued)

*Primary Examiner* — Justin R Knapp
(74) *Attorney, Agent, or Firm* — Christopher P. Maiorana, PC (57) ABSTRACT

A circuit having a first circuit and a memory is disclosed. The first circuit may be configured to (i) receive a control signal that identifies a current one of a plurality of wireless communication standards and a code word size and (ii) generate a plurality of tables corresponding to both the current wireless communication standard and the code word size. Each of the tables generally has a plurality of indices. Up to two of the indices may be generated by the first circuit per clock cycle. Each of the tables generally comprises a permutation table of a turbo code interleaver. The memory may be configured to store the tables.

20 Claims, 8 Drawing Sheets

(56) References Cited

U.S. PATENT DOCUMENTS

| | | | |
|---|---|---|---|
| 7,343,531 B2* | 3/2008 | Shih | 714/702 |
| 7,552,377 B1* | 6/2009 | Jones | 714/759 |
| 7,949,926 B2* | 5/2011 | Nimbalker et al. | 714/755 |
| 2003/0096634 A1 | 5/2003 | Lin | 455/560 |
| 2004/0220988 A1* | 11/2004 | Barry et al. | 708/446 |
| 2005/0193308 A1* | 9/2005 | Shin | 714/752 |
| 2006/0004994 A1 | 1/2006 | Uriu et al. | 712/226 |
| 2006/0039317 A1 | 2/2006 | Subramanian et al. | 370/328 |
| 2008/0002657 A1* | 1/2008 | Pisek et al. | 370/342 |
| 2008/0104478 A1* | 5/2008 | Oz et al. | 714/755 |
| 2008/0115032 A1* | 5/2008 | Henige et al. | 714/755 |
| 2009/0138668 A1 | 5/2009 | Blankenship | 711/157 |
| 2010/0268918 A1* | 10/2010 | Priewasser et al. | 712/208 |
| 2011/0087949 A1* | 4/2011 | Dilonardo et al. | 714/768 |

OTHER PUBLICATIONS

Myoung-Cheol Shin; In-Cheol Park, "Processor-based turbo interleaver for multiple third-generation wireless standards," Communications Letters, IEEE, vol. 7, No. 5, pp. 210,212, May 2003, doi: 10.1109/LCOMM.2003.812176.*

Steven W. Smith; "The Scientist and Engineer's Guide to Digital Signal Processing"; Chapter 28 Circular Buffering; 1997-1998; http://www.dspguide.com/ch28/2.htm.*

Rijshouwer and van Berkel, A Programmable Scalable-Throughput Interleaver, Jan. 2010, EURASIP Journal on Wireless Communications & Networking;2010, Special section p. 1, http://connection.ebscohost.com/c/articles/57314141/programmable-scalable-throughput-interleaver.*

R. Asghar, D. Wu, J. Eilert, and D. Liu, "Memory conflict analysis and implementation of a re-configurable interleaver architecture supporting unified parallel turbo decoding," in Proceedings of the 12th EUROMICRO Conference on Digital System Design (DSD '09), Patras, Greece, 2009.*

E.J.C. Rijshouwer, The Design of a Reconfigurable Interleaver Architecture for Software Defined Radio, Technische Universiteit Eindhoven Department of Mathematics and Computer Science, Eindhoven, Nov. 2006.*

* cited by examiner

(1) $P_i = (f_1 \cdot i + f_2 \cdot i^2) \bmod K$ (2) $P_{i+1} = (f_1 \cdot (i+1) + f_2 \cdot (i+1)^2) \bmod K$
$= (f_1 \cdot i + f_1 + f_2 \cdot i^2 + 2f_2 \cdot i + f_2) \bmod K$
$= (f_1 \cdot i + f_2 \cdot i^2) \bmod K + (f_1 + f_2) + 2f_2 \cdot i$
$= P_i + 2f_2 \cdot i + (f_1 + f_2)$ (3) $P_1 = (f_1 + f_2) \bmod K$ (4) $Q_1 = 2 \cdot f_2$ (5) $P_{i+1} = P_i + Q_i + (f_1 + f_2)$ (6) $Q_{i+1} = Q_i + 2 \cdot f_2$

PROGRAMMABLE CIRCUIT FOR HIGH SPEED COMPUTATION OF THE INTERLEAVER TABLES FOR MULTIPLE WIRELESS STANDARDS

This application claims the benefit of Russian Application No. 2010111027, filed Mar. 24, 2010 and is hereby incorporated by reference in its entirety.

FIELD OF THE INVENTION

The present invention relates to wireless communications generally and, more particularly, to a method and/or apparatus for implementing a programmable circuit for high speed computation of the interleaver tables for multiple wireless standards.

BACKGROUND OF THE INVENTION

Wireless standards are using turbo codes intensively. Interleaver tables are conventionally implemented in standard compliant circuitry either for turbo encoding or turbo decoding. An interleaver table represents a sequence of permutation indices applied to a code word while encoding or decoding. If the code word has N bits, a corresponding interleaver table has N integer numbers. Each wireless standard describes a set of possible sizes of the code words. For example, the Wideband-CDMA (WCDMA) standard permits code words of any size from 40 bits to 5114 bits. Therefore, the total size of all interleaver tables for the WCDMA standard would be 13,078,275 integer numbers. If a size of each integer number is 2 bytes, direct storage of all possible interleaver tables in memory for the WCDMA standard alone consume approximately 25 megabytes of memory.

Another conventional way of obtaining the interleaver tables is to generate the tables at run time. The run time approach is commonly implemented in existing designs. However, each such design is targeted at a single wireless standard.

A direct way to support several standards in a single design is to have several computing schemes—a single scheme for each standard. Moreover some standards, for example the Long Term Evolution (LTE) standard, have detailed descriptions of such computing schemes. Some disadvantages of implementing multiple computing schemes concern inflexibility. A change in a standard or an appearance of a new standard cannot be supported. Implementing multiple computing schemes also uses a large area and results in significant power consumption. Another disadvantage concerns complexity. The complexity of the whole design matches a sum of the complexities of the individual schemes for each standard. Furthermore, if a general purpose processor is used to generate the interleaver tables, the area and the power consumption of such a solution will be high and will result in a low data rate.

SUMMARY OF THE INVENTION

The present invention concerns an apparatus having a first circuit and a memory. The first circuit may be configured to (i) receive a control signal that identifies a current one of a plurality of wireless communication standards and a code word size and (ii) generate a plurality of tables corresponding to both the current wireless communication standard and the code word size. Each of the tables generally has a plurality of indices. Up to two of the indices may be generated by the first circuit per clock cycle. Each of the tables generally comprises a permutation table of a turbo code interleaver. The memory may be configured to store the tables.

The objects, features and advantages of the present invention include providing a programmable circuit for high speed computation of the interleaver tables for multiple wireless standards that may (i) provide a software controlled special parallelized arithmetic logic unit (ALU), (ii) provide high speed in computing interleaver tables for multiple wireless standards, (iii) compute up to two interleaver table indices per clock cycle, (iv) use less memory to store the interleaver tables compared with conventional multi-standard techniques, (v) use less area than conventional techniques and/or (vi) consume less power than conventional techniques.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally concern a programmable chip for computing interleaver tables in accordance with one or more wireless communication standards. The wireless communications standards may include, but are not limited to, a Long Term Evolution (LTE) standard (3GPP Release 8), an Institute of Electrical and Electronics Engineering (IEEE) 802.16 standard (WiMAX), a Wideband-CDMA/High Speed Packet Access (WCDMA/HSPA) standard (3GPP Release 7) and a CDMA-2000/Ultra Mobile Broadband (UMB) standard (3GPP2). Instead of using a separate scheme for each wireless communication standard, the standards may be supported programmatically. For each standard, a specific program controls the generation of one or more corresponding interleaver tables. Therefore, future wireless communication standards may be supported by means of appropriate programming. Furthermore, changes to existing wireless communication standards are generally accommodated by changes to the corresponding programs.

Figure 1:
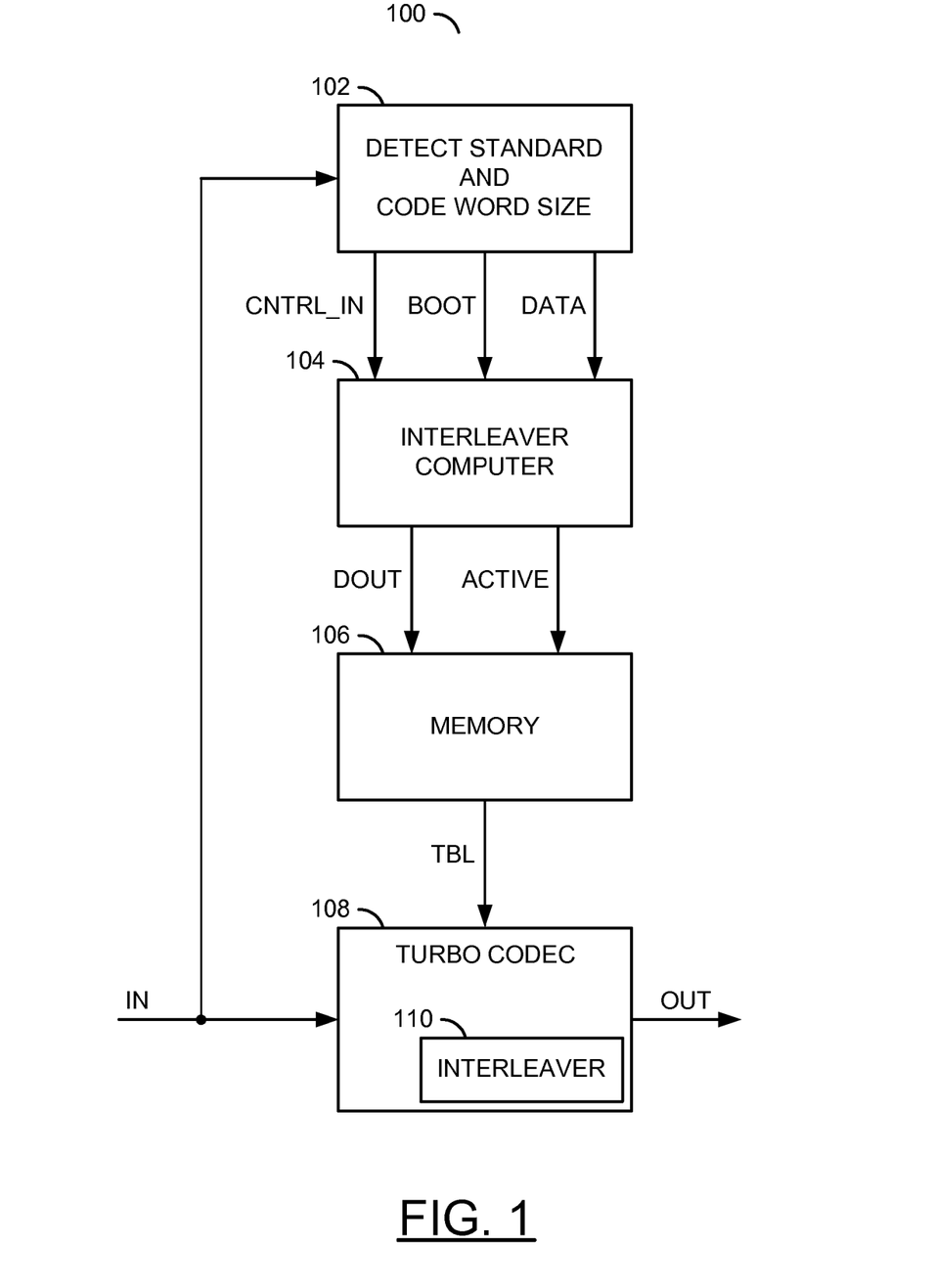
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus (or system) 100 generally comprises a circuit (or module) 102, a circuit (or module) 104, a circuit (or module) 106 and a circuit (or module) 108. The circuits 102-108 may represent modules and/or blocks that, may be implemented as hardware, software, a combination of hardware and software, or other implementations.

A control signal (e.g., CNTRL_IN) may be generated by the circuit 102 and received by the circuit 104. One or more boot signals (e.g., BOOT) may also be generated by the circuit 102 and received by the circuit 104. The circuit 102 may generate a data signal (e.g., DATA) that is transferred to the circuit 104. A data output signal (e.g., DOUT) may be generated by the circuit 104 and presented to the circuit 106. A signal (e.g., ACTIVE) may also be generated by the circuit 104 and received by the circuit 106. The circuit 106 may generate a signal (e.g., TBL) that is transferred to the circuit 108. An input signal (e.g., IN) may be received by the circuit 108. The circuit 108 may generate an output signal (e.g., OUT).

The circuit 102 generally implements a detection circuit. The circuit 102 may be operational to detect one or more wireless communication standards being utilized by the apparatus 100. In some embodiments, the detection may be based on the signal IN. In other embodiments, the detection may be based on other signals received by the circuit 102, for example, configuration data received from a smart card of a cellular telephone. The circuit 102 generally creates the signal CNTRL_IN to control the operations of the circuit 104. The signals BOOT and DATA may be generated by the circuit 102 to provide information used by the circuit 104 to create interleaver tables.

The circuit 104 generally implements an interleaver computer. The circuit 104 may be operational to generate the interleaver tables based on the information and controls received from the circuit 102 via the signals CNTRL_IN, BOOT and DATA. The circuit 104 generally contains a special arithmetic logic unit (ALU) that may be optimized for operations used for computing interleaver tables. Moreover, the ALU may perform several such computation operations at a time. The parallel manner of computing generally provides a high performance of the circuit 104. The signal DOUT may be used to present the interleaver tables to the circuit 106.

The circuit 106 may implement a memory circuit. The circuit 106 is generally operational to buffer one or more interleaver tables at a time. The interleaver tables may be received from the circuit 104 in the signal DOUT. The circuit 106 may transfer the interleaver tables to the circuit 108 in the signal TBL.

The circuit 108 generally implements a codec circuit. The circuit 108 may be operational to encode and/or decode the signal IN to generate the signal OUT. The encoding/decoding generally utilizes the one or more interleaver tables as received from the circuit 106 via the signal TBL. The circuit 108 may include an internal circuit (or module) 110 to perform the interleaver operations. In some embodiments, the codec performed by the circuit 108 may be a turbo codec. Other codecs may be implemented to meet the criteria of a particular application.

The circuits 102 and 104 are generally fabricated on a common die (or chip). In some embodiments, the circuit 106 may be fabricated on a different die (or chip) than the circuits 102 and 104. In some embodiments, the circuit 108 may be fabricated on yet another die (or chip) separate from the circuits 102-106. In other embodiments, the circuit 108 may be fabricated on the same die as the circuits 102 and 104. For system-on-a-chip implementations, all of the circuits 102-108 may be fabricated on a common die.

Figure 2:
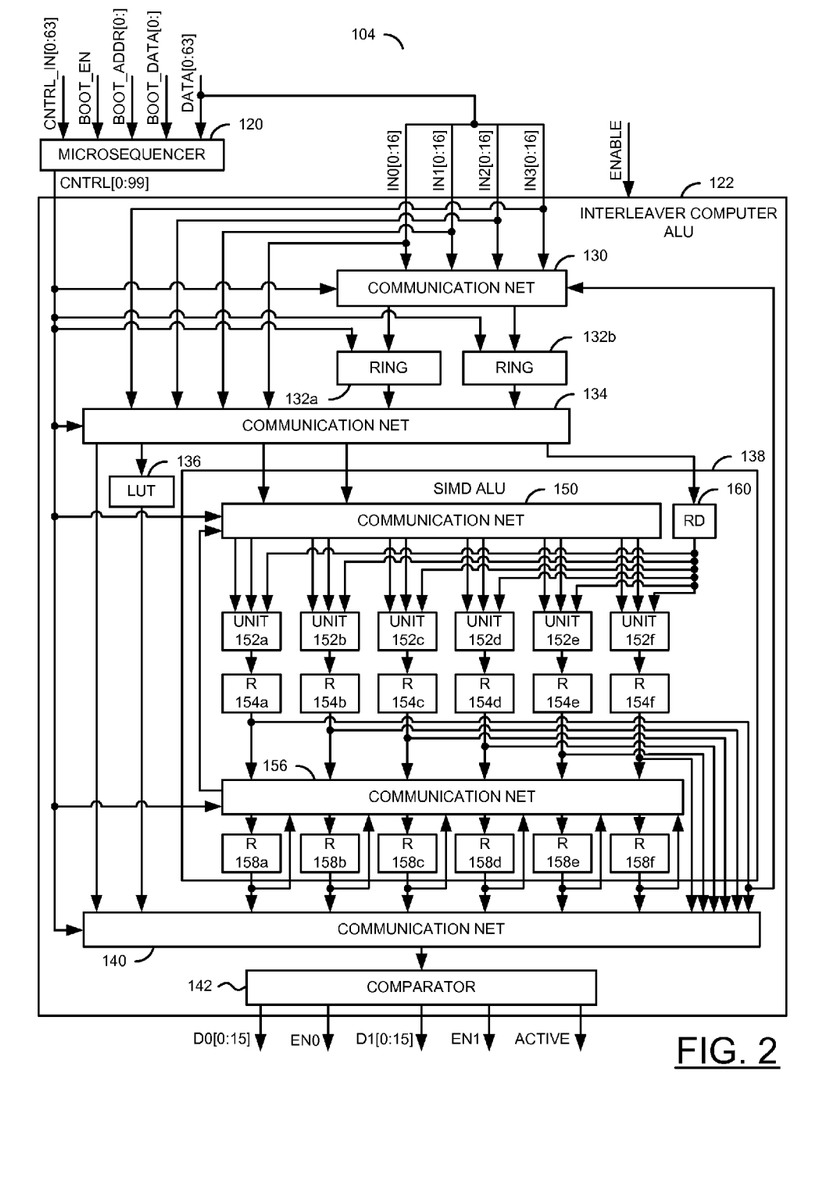
FIG. 2 is a block diagram of an example implementation of an interleaver computer.

Referring to FIG. 2, a block diagram of an example implementation of the circuit 104 is shown. The circuit 104 generally comprises a circuit (or module) 120 and a circuit (or module) 122. The circuits 120-122 may represent modules and/or blocks that may be implemented as hardware, software, a combination of hardware and software, or other implementations.

The signal CNTRL_IN may be received by the circuit 120. The signal BOOT generally comprises an enable signal (e.g., BOOT_EN), an address signal (e.g., BOOT_ADDR) and a data signal (e.g., BOOT_DATA). Each signal BOOT_EN, BOOT_ADDR and BOOT_DATA may be received by the circuit 120. The signal DATA may be received by the circuit 120 and in part by the circuit 122. A global signal (e.g., ENABLE) may be received by the circuits 120 and 122 (shown).

The signal DATA may comprise multiple input signals (e.g., IN0, IN1, IN2 and IN3). The signals IN0-IN3 may be received by the circuit 122. A control signal (e.g., CNTRL) may be generated by the circuit 120 and presented to the circuit 122. The circuit 122 may generate and present the signal DO and the signal ACTIVE. The signal DOUT generally comprises data output signals (e.g., D0 and D1) and corresponding enable signals (e.g., EN0 and EN1).

The circuit 120 generally implements a microsequencer circuit. The circuit 120 may be operational to read from an internal memory instruction sets corresponding to the determined wireless communication standards. The circuit 120 may also generate sequences of micro-commands (program instructions) to configure the circuit 122 according to the instruction sets. Selection of the appropriate instruction sets may be based on the signals CNTRL_IN, BOOT and DATA as received from the circuit 102.

The circuit 122 generally implements an interleaver computer circuit. The circuit 122 may be operational to generate one or more interleaver tables based on the controls received in the signal CNTRL and the data received in the signals IN0-IN3. The interleaver tables may be presented to the circuit 106 in the signals D0 and D1, as governed by the signals EN0, EN1 and ACTIVE. In various embodiments, the circuit 122 may generate up to two indices of the interleaver tables in each clock cycle.

The circuit 122 generally comprises a circuit (or module) 130, multiple circuits (or modules) 132a-132b, a circuit (or module) 134, a circuit (or module) 136, a circuit (or module) 138, a circuit (or module) 140 and a circuit (or module) 142. The circuits 130-142 may represent modules and/or blocks that may be implemented as hardware, software, a combination of hardware and software, or other implementations.

The circuit 130 may implement a communication network circuit. The circuit 130 may be operational to route data received (i) through the signals IN0-IN3 and (ii) from the circuit 138 to the circuits 132a-132b. Routing through the circuit 130 may be controlled by the signal CNTRL.

Each circuit 132a-132b may implement a ring register circuit. Each circuit 132a-132b generally comprises several shift registers connected in a loop. A length of the loop may be configured by the circuit 120 via the signal CNTRL. The circuits 132a-132b are generally operational to shift the data received from the circuit 130 around the ring of registers. Thereafter, the circuits 132a-132b may perform next operations, including, but not limited to, stay, shift, write and shift operations. Coding of the operations may be also provided by the circuit 120. A particular register in each circuit 132a-132b may present the contents buffered therein to the circuit 134.

The circuit 134 may implement another communication network circuit. The circuit 134 may be operational to route data (i) from the signals IN0-IN3 and (ii) from the circuits 132a-132b to the circuits 136 and 138. Routing through the circuit 134 may be controlled by the signal CNTRL.

The circuit 136 may implement a lookup table (LUT) circuit. The circuit 136 is generally operational to store lookup information received from the circuit 134. The circuit 136 generally stores root values for the current permutation table.

Usually the root values may be loaded from the header of the interleaver data frame. The stored information may be presented to the circuit 140.

The circuit 138 may implement an arithmetic logic unit (ALU) circuit. The circuit 138 is generally operational to generate the indices of the interleaver tables based on the information received from the circuit 134. Calculations within the circuit 138 may be controlled by the circuit CNTRL. In some embodiments, the circuit 138 may be implemented as a single instruction multiple data (SIMD) processor circuit.

The circuit 140 may implement another communication network circuit. The circuit 140 is generally operational to route the data received from the circuits 134, 136 and 138 to the circuit 142. Routing through the circuit 140 is generally controlled by the signal CNTRL.

The circuit 142 may implement a comparator circuit. The circuit 142 generally comprises a ring register, a comparator and an adder. The circuit 142 is generally operational to perform some final adding operations and check whether the permutation indices are less than or equal to the code word size.

The circuit 138 generally comprises a circuit (or module) 150, several circuits (or modules) 152a-152f, several circuits (or modules) 154a-154f, a circuit (or module) 156, several circuits (or module) 158a-158f and a circuit (or module) 160. The circuits 150-160 may represent modules and/or blocks that may be implemented as hardware, software, a combination of hardware and software, or other implementations.

The circuit 150 may implement a communication network circuit. The circuit 150 is generally operational to route data received from the circuits 134 and 156 to the circuits 152a-152f. Routing of the data through the circuit 150 may be controlled by the signal CNTRL.

Each circuit 152a-152f may implement a logic unit circuit. The circuits 152a-152f are generally operational to process three operands to calculate a result. Two of the operands may be received by each circuit 152a-152f from the circuit 150. Another operand for each circuit 152a-152f may be received from the circuit 160. The results may be presented to the circuits 154a-154f respectively.

Each circuit 154-154f may implement a register circuit. The circuits 154a-154f are generally operational to buffer the results received from a respective circuit 152a-152f. The buffered results may be presented to both the circuit 156 and the circuit 140. The results from at least one circuit (e.g., 154a) may also be presented back to the circuit 130.

The circuit 156 may implement a communication network circuit. The circuit 156 is generally operational to route data received from (i) the circuits 154a-154f and (ii) the circuits 158a-158f to the circuits 158a-158f. Routing of the data through the circuit 156 may be controlled by the signal CNTRL.

Each circuit 158-158f may implement a register circuit. The circuits 158a-158f are generally operational to buffer the results received from the circuit 156. The buffered results may be presented to both the circuit 140 and back to the circuit 156.

The circuit 160 may implement a register circuit. The circuit 160 is generally operational to buffer an operand used by the circuits 152a-152f. The circuit 160 may receive the operand from the circuit 134. The buffered data may be presented to each circuit 152a-152f.

The circuit 122 is generally controlled by the circuit 120. The circuit 120 may read the corresponding program from memory, depending on the standard in use as determined by the circuit 102. The circuit 120 may act upon the programs to generate sequences of the micro-commands for the circuit 122. Each micro-command generally describes a behavior of the sub modules and interconnections there between of the circuit 122.

The circuit 104 generally functions as follows. A program may be loaded in the circuit 120 once a wireless communication standard has been identified by the circuit 102. The program generally depends on the identified wireless communication standard. The circuit 120 may begin generating sequences of micro-commands (instructions) from the program. At the same time, an interleaver data frame that depends on the current code word size may be received by the circuits 120 and 122 in the signal DATA. A header of the interleaver data frame generally stores information that is loaded into the circuits 132a-132b, 136 and 142.

Generally, all of the components within the circuit 122 may be loaded and configured before computation starts. For some standards, such as the LTE standard, not all of the components may be loaded and/or configured. The header is generally loaded into circuit 122 by means of the micro-commands generated by circuit 120. The micro-commands may control the behavior of all the blocks within the circuit 122. Therefore, each sequence of commands generated by circuit 120 may start with loading the header. After the header is successfully loaded into the circuit 122, computation of the permutation tables may begin. In each clock cycle, the circuit 122 may calculate one, two or none of the permutation indices. The indices generally appear in the signals D0 and D1. For each valid index, the corresponding signal EN0 and EN1 may be asserted (e.g., a logical one or high value). If either index is not valid, the corresponding signal EN0 and EN1 may be deasserted (e.g., a logical zero or low value). The signal ACTIVE generally tells about activity of the whole scheme. The signal ACTIVE may be asserted when valid indices are available and deasserted otherwise.

Each circuit 152a-152f may perform several operations such as adding, modular adding and bitwise operations over multiple (e.g., 3) operands. Therefore, the circuit 122 may be sufficiently flexible to support different standards on (in) a single chip. Each circuit 152a-152f may have two operands received from the signals IN0-IN3 as well as from other circuits 152a-152f, the circuits 132a-132b, 136 and 160. Each circuit 152a-152f may be configured from the outside to perform certain operations at the particular moment. Operands for each circuit 152a-152f are generally provided by means of the circuits 130, 134, 140, 150 and 156.

Figure 3:
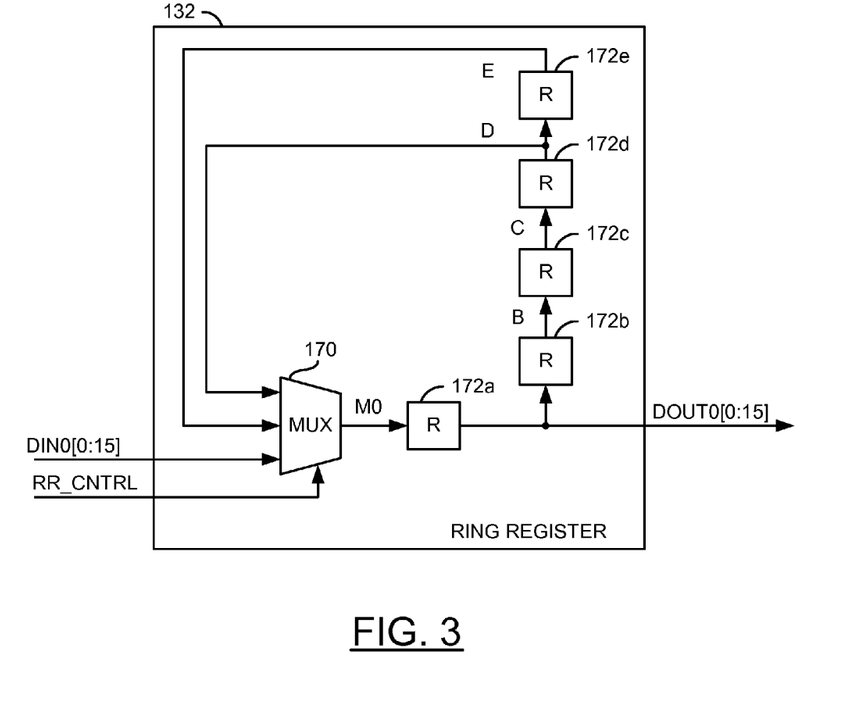
FIG. 3 is a block diagram of an example implementation of a ring register.

Referring to FIG. 3, a block diagram of an example implementation of a circuit 132 is shown. The circuit 132 may represent the circuits 132a-132b. The circuit 132 generally comprises a circuit (or module) 170 and several circuits (or modules) 172a-172e. The circuits 170-172e may represent modules and/or blocks that may be implemented as hardware, software, a combination of hardware and software, or other implementations.

A data input signal (e.g., DIN0) may be received by the circuit 170 from an external source (e.g., from the circuit 130). A control signal (e.g., RR_CNTRL) may also be received by the circuit 170 from the circuit 120. The circuit 170 may receive a signal (e.g., E) from the circuit 172e. The circuit 170 may also receive a signal (e.g., D) from the circuit 172d. A signal (e.g., M0) may be generated by the circuit 170 and presented to the circuit 172a. The circuit 172a may generate and present a data output signal (e.g., DOUT0) to both the circuit 172b and external to the circuit 130 (e.g., to the circuit 134). The circuit 172b may generate a signal (e.g., B) which is presented to the circuit 172c. A signal (e.g., C) may be generated by the circuit 172c and presented to the circuit 172*d*. The circuit 172*d* may generate and present the signal D to both the circuit 170 and the circuit 172*e*. The circuit 172*e* may generate and present the signal E back to the circuit 170.

The circuit 170 may implement a multiplex circuit. The circuit 170 may be operational to multiple the signals DIN0, D and E to the signal M0. Control of the multiplexing may be provided by the signal RR_CNTRL. The signal RR_CNTRL may be contained in the signal CNTRL.

Each circuit 172*a*-172*e* may implement a multi-bit register circuit. The circuits 172*a*-172*e* may be linked serially to form loops back to the initial circuit 172*a* through the circuit 170.

Depending on the currently used wireless communication standard and, in some cases the code word size, a length of the loop formed around the circuits 170 and 170*a*-172*e* may be configured differently. Thus, a single circuit 130 may have several variable configurations that differ by the length of the loop. To support the LTE, WiMAX, WCDMA/HSPA and CDMA-2000/UMB standards, the following five loop lengths may be implemented in the circuit 130: 4, 5, 10, 20 and 32 register delays (only two loop lengths are shown in FIG. 3).

Figure 4:
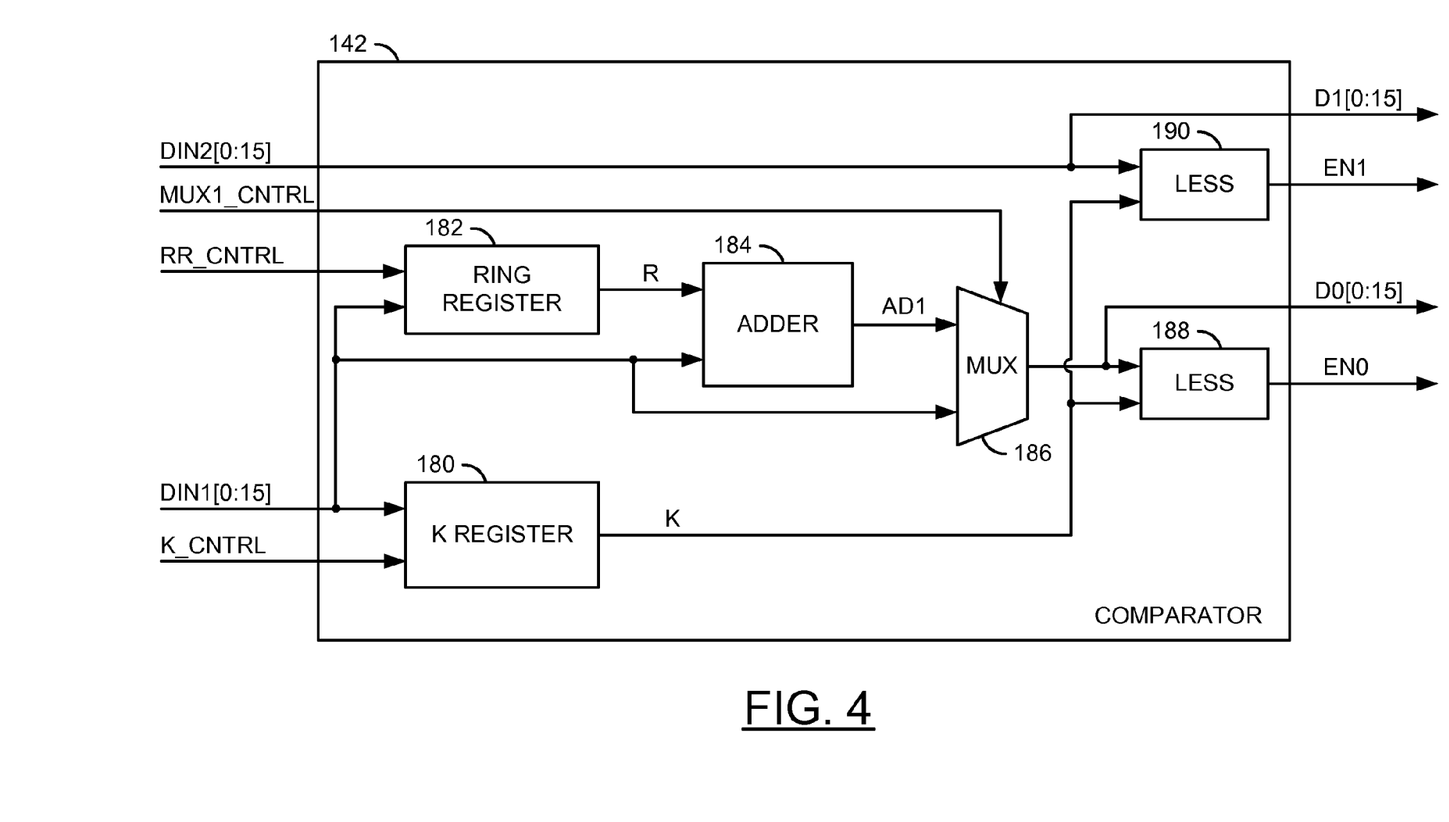
FIG. 4 is a block diagram of an example implementation of a comparator circuit.

Referring to FIG. 4, a block diagram of an example implementation of the circuit 142 is shown. The circuit 142 generally comprises a circuit (or module) 180, a circuit (or module) 182, a circuit (or module) 184, a circuit (or module) 186, a circuit (or module) 188 and a circuit (or module) 190. The circuits 180-190 may represent modules and/or blocks that may be implemented as hardware, software, a combination of hardware and software, or other implementations.

A code word size control signal (e.g., K_CNTRL) may be received by the circuit 180 from the circuit 120. A data input signal (e.g., DIN1) may be received by the circuits 180, 182, 184 and 186 from the circuit 140. The circuit 182 may also receive the signal RR_CNTRL from the circuit 120. A multiplex control signal (e.g., MUX1_CNTRL) may be received by the circuit 186 from the circuit 120. A data input signal (e.g., DIN2) may be (i) received by the circuit 190 from the circuit 140 and (ii) presented from the circuit 142 as the signal D1. The circuit 180 may generate and present a signal (e.g., K) to the circuits 188 and 190. The circuit 186 may generate the signal DO which is presented to the circuit 188 and external to the circuit 142. A signal (e.g., R) may be generated by the circuit 182 and presented to the circuit 184. The circuit 184 may generate a signal (e.g., AD1) received by the circuit 186.

The circuit 180 may implement a register circuit. The circuit 180 is generally operational to store the code word size received in the signal DIN1. The code word size may be presented in the signal K.

The circuit 182 may implement a ring register circuit. In some embodiments, the circuit 182 may be similar to the circuit 132. The circuit 182 generally comprises several shift registers connected in loops. A length of the active loop may be configured by the circuit 120 via the signal RR_CNTRL. The circuit 182 is generally operational to shift data around the ring of registers. A particular register in the circuit 182 may present the contents buffered therein in the signal R. The signal RR_CNTRL may form part of the signal CNTRL.

The circuit 184 may implement an adder circuit. The circuit 184 may be operational to add the integer arguments received in the signals DIN1 and R to calculate a value in the signal AD1.

The circuit 186 may implement a multiplexer circuit. The circuit 186 is generally operational to multiplex the signals DIN0 and AD1 to generate the signal DO. The circuit 186 selects whether to use or not to use the adding operation of the circuit 184. Control of the multiplexing may be achieved by the signal MUX1_CNTRL. The signal MUX1_CNTRL may form part of the signal CNTRL.

The circuits 188 and 190 may implement compare circuits. Each circuit 188 and 190 is generally operational to compare a respective value in the signals D0 and D1 with the code word size in the signal K. If the value of the signal D0 is not greater than the code word size, the signal EN0 may be asserted. If the value of the signal D0 is greater than the code word size, the signal EN0 may be deasserted. If the value of the signal D1 is no greater than the code word size, the signal EN1 may be asserted. If the value of the signal D1 is greater than the code word size, the signal EN1 may be deasserted.

The signal ACTIVE may be generated to match the signal ENABLE. If the signal ENABLE is in a true state (e.g., a logical one or high), functioning of the computing scheme may be permitted. For example, writing operations to any of the registers may be possible. If the signal ENABLE is in a false state (e.g., a logical zero or low), functioning of the computing scheme may be frozen.

The circuit 142 generally performs a final adding operation where appropriate (e.g., for WCDMA/HSPA and WiMAX, but not for LTE). The circuit 142 may also check whether permutation indices are less than or equal to the code word size in the signal K.

Figure 5:
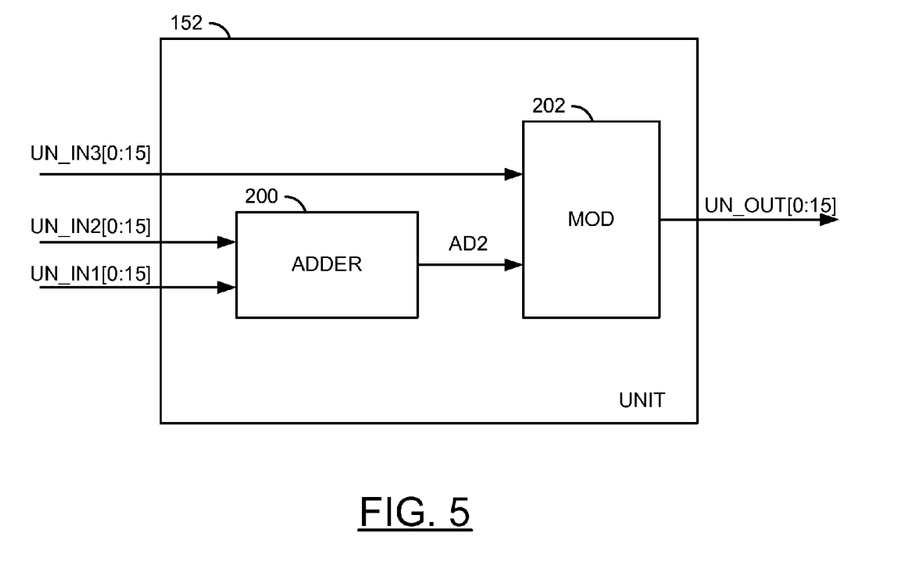
FIG. 5 is a block diagram of an example implementation of a calculation unit.

Referring to FIG. 5, a block diagram of an example implementation of a circuit 152 is shown. The circuit 152 may represent the circuits 152*a*-152*f*. The circuit 152 generally comprises a circuit (or module) 200 and a circuit (or module) 202. The circuits 200-202 may represent modules and/or blocks that may be implemented as hardware, software, a combination of hardware and software, or other implementations.

Multiple data input signals (e.g., UN_IN1 and UN_IN2) may be received by the circuit 200 from the circuit 150. Another data input signal (e.g., UN_IN3) may be received by the circuit 202 from the circuit 160. A signal (e.g., AD2) may be generated by the circuit 200 and presented to the circuit 202. The circuit 202 may generate a signal (e.g., UN_OUT) which is present to a corresponding circuit 154*a*-154*f*.

The circuit 200 may implement an adder circuit. The circuit 200 is generally operational to generate a sum value in the signal AD2 by adding the integer arguments received in the signals UN_IN1 and UN_IN2.

The circuit 202 may implement an integer modulus division circuit. The circuit 202 may be operational to compute a reminder of integer division of the value in the signal AD2 by the value in the signal UN_IN3. The resulting value may be presented in the signal. UN_OUT.

Figure 6:
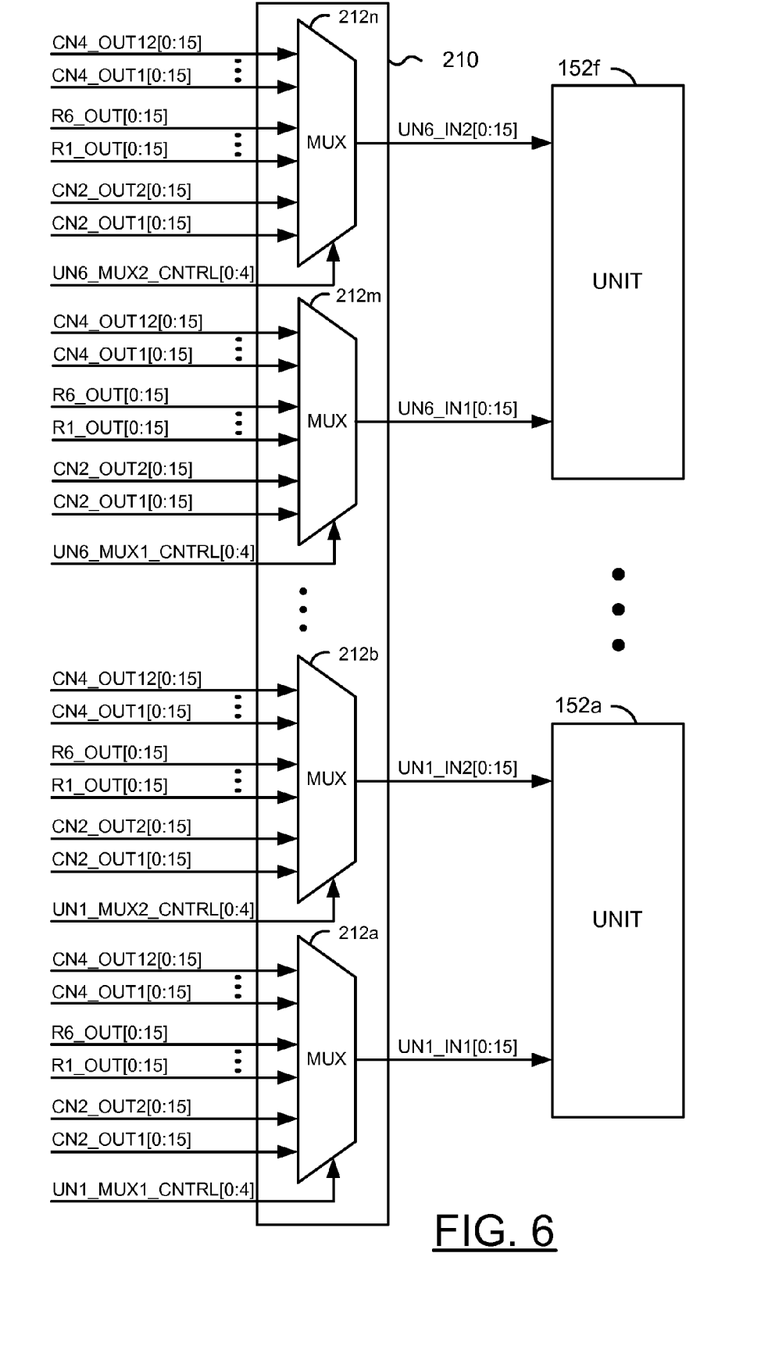
FIG. 6 is a block diagram of an example implementation of a communication network circuit.

Referring to FIG. 6, a block diagram of an example implementation of a circuit 210 is shown. The circuit 210 may represent the circuits 130, 134, 140, 150 (illustrated) and 156. The circuit 210 generally comprises several circuits (or modules) 212*a*-212*n*. The circuits 212*a*-212*n* may represent modules and/or blocks that may be implemented as hardware, software, a combination of hardware and software, or other implementations.

Each circuit 212*a*-212*n* may implement a multiplexer circuit. The circuits 212*a*-212*n* are generally operational to multiplex data from input ports to output ports. The circuit 210 may provide interconnections between sub-modules of the circuit 122. Control of the multiplexing may be established by respective signals (e.g., UN1_MUX1_CNTRL to UN6_MUX2_CNTRL). The control signals may form part of the signal CNTRL.

Figure 7:
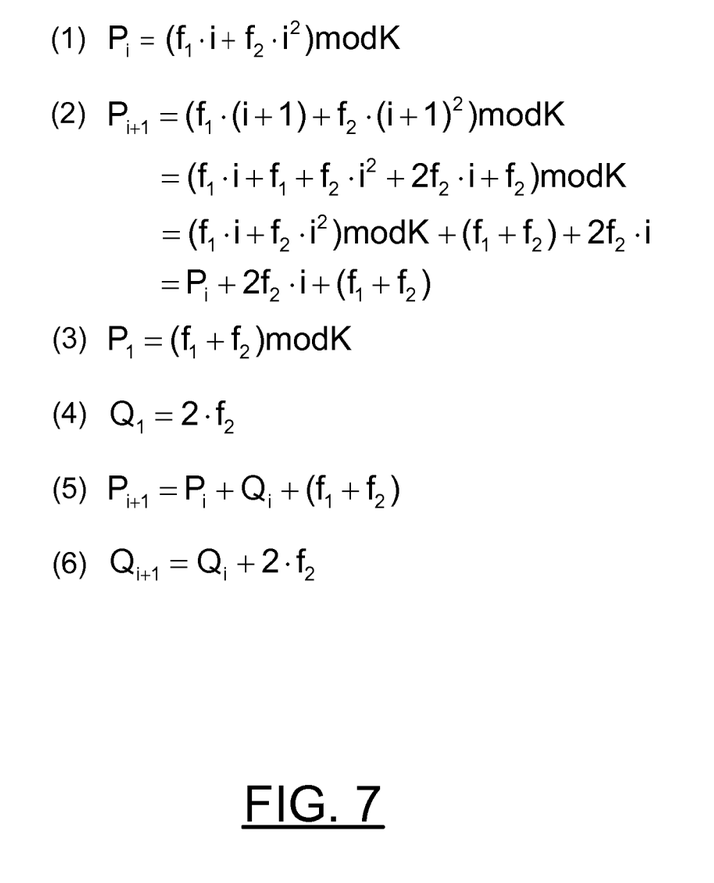
FIG. 7 is a set of formulae.

Referring to FIG. 7, a set of formulae is shown. An example of configuring the apparatus 100 to implement the LTE standard is provided as follows. In the example, the circuit 104 generally supports computation of a permutation table at double speed (e.g., each clock cycle may produce permutation indices in each of the signals D0 and D1). Single speed operations may also be possible, where the indices may be presented in the signal D0.

Assume that the code word has length K. In case of the LTE standard, computation of the permutation indices may be performed by formula (1). In formula (1), Pi may be the permutation indices where i=0, . . . , K. The parameters f1 and f2 generally depend on the code word length K and are defined in the Table 5.1.3-3 of the LTE description document. Therefore, Pi+1 may be given by formula (2). Furthermore, denote 2×f2×i as Qi and rewrite the following recurrent equation set (3) to (6). The circuit 122 generally computes the permutation indices according to the recurrent process of formulae (3) to (6). Functioning of the circuit 122 in the example is generally controlled by the following program for the circuit 120:

```
proc main {
    call @A * 3;
    call @B * 1;
    call @C * R0;
}
```

Labels A, B and C may be the names of instructions. The instructions are generally described below. Command call @A *3; generally means that the circuit 120 may send instruction A to the circuit 122 three times. Command call @C*R0; generally means that the circuit 120 may send instruction C to the circuit 122 for the number of times stored in a register R0. Configuration of the circuit 122 in a case of three computation units may be described as follows:
IntrlInstr
  Interleaver Computer ALU enable
  SIMD ALU enable
  Load modulus into register 160
  Set Computation Unit commands
  Set Communication Net 150 multiplex controls
  Set Communication Net 156 multiplex and decoder controls
  Set Lookup Table (LUT) write enable
  Set LUT counter to zero
  Set Ring Register control
  Set Ring Register variant
  Set Comparator control
  Set Communication Nets 130, 134 and 140 multiplex controls
Instructions A, B and C are generally described in as follows:
//On the following instruction, IN2=(f1+f2) and IN3=K
Instruction @A=
  Load modulus K into register 160
  Set NOPs to all units
  Set IN2 on the inputs of the registers 158a-158f
  Choose register 158a to buffer IN2
  Send IN2 on the signal CN2_OUT1
//On the following instruction, IN2=(2×f2)
Instruction @B=
  Do not load modulus
  Set NOPs to all units
  Set IN2 on the inputs of the registers 158a-158f
  Choose register 158b to buffer IN2
  Send IN2 on the signal CN2_OUT1
//On the following instruction, inputs IN0-IN3 are not used
Instruction @C=
  Do not load modulus
  Set Modulus Addition for all units
  UN1_IN1=R2_OUT
  UN1_IN2=R7_OUT
  UN2_IN1=R8_OUT
  UN2_IN2=R2_OUT
  UN3_IN1=R1_OUT
  UN3_IN2=R3_OUT
  Choose none from registers 158a-158f
  Send IN2 on the CN2_OUT1
Instructions A and B generally writes the sum of (f1+f2) into the register 158a, the code word size K into the register 160 and the product 2×f2 into the register 158b.

Figure 8:
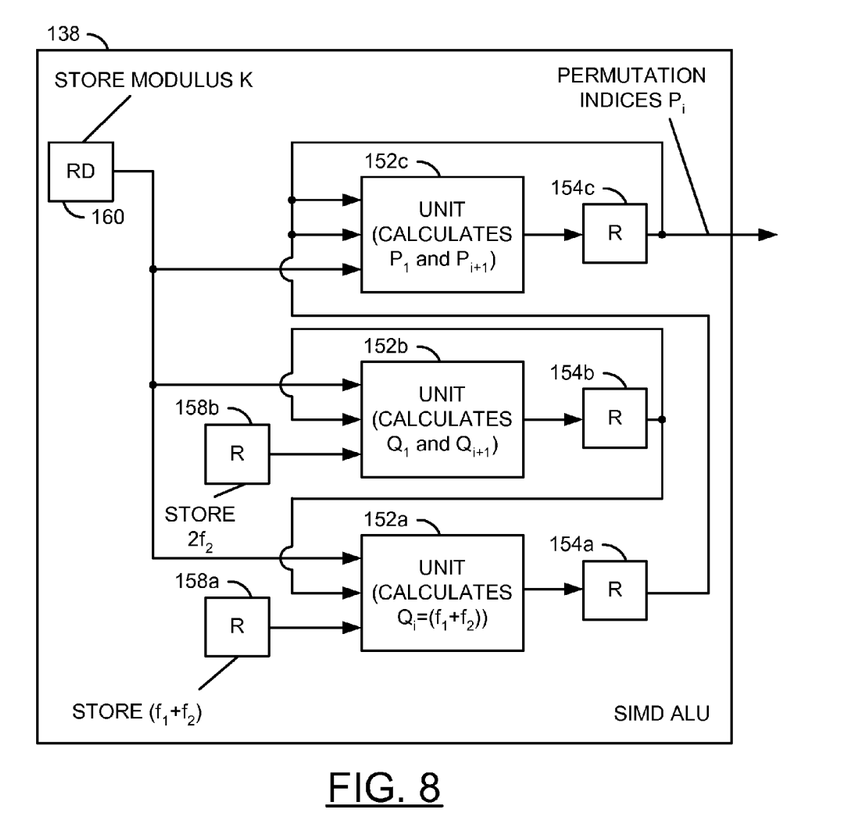
FIG. 8 is a block diagram of example interconnections between blocks of an arithmetic logic unit on an instruction.

Referring to FIG. 8, a block diagram of example interconnections between blocks of the circuit 138 on instruction C is shown. The circuit 152a may receive in the operands in (i) the signal UN1_IN1 from the circuit 154b and (ii) the signal UN1_IN2 from the circuit 158a. The circuit 152b may receive the operands in (i) the signal IN2_IN1 from the circuit 158b and (ii) the signal UN2_IN2 from the circuit 154b. The circuit 152c may receive the operands in (i) the signal UN3_IN3 from the circuit 154a and (ii) the signal UN3_IN2 from the circuit 154c. The modulus value K may not be loaded into the circuit 160. The circuit 152a may calculate Q1 per formula (4) in a given clock cycle and Qi+1 per formula (6) thereafter. The circuit 152b may calculate a portion of formula (5). The circuit 152c may calculate P1 per formula (3) in the given clock cycle and Pi+1 per formula (5) thereafter.

The functions performed by the diagrams of FIGS. 1-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a detection circuit configured to generate a control signal in response to a received signal, wherein said control signal identifies a current one of a plurality of wireless communication standards and a code word size;
a first circuit configured to (i) receive said control signal, (ii) generate one or more tables corresponding to both said current wireless communication standard and said code word size, wherein (a) each of said tables has a plurality of indices, (b) two of said indices in at least one of said tables are generated by said first circuit per clock cycle and (c) each of said tables comprises a permutation table of an interleaver, and (iii) assert a given signal in response to said indices being available; and
a memory configured to store said tables in response to said assertion of said given signal.

2. The apparatus according to claim 1, further comprising a second circuit separate from said first circuit and including said interleaver configured to interleave an input signal per a turbo code according to at least one of said tables.

3. The apparatus according to claim 1, wherein said first circuit comprises a microsequencer configured to generate a plurality of instructions based on both said current wireless communication standard and said code word size.

4. The apparatus according to claim 3, wherein (i) said first circuit is further configured to generate said tables based on a data frame received by said microsequencer and (ii) said generation of said tables is controlled by said instructions.

5. The apparatus according to claim 3, wherein (i) said first circuit further comprises a plurality of registers arranged in a ring, (ii) each of said rings has a variable length and (iii) each length of said variable lengths is controlled by said instructions.

6. The apparatus according to claim 3, wherein (i) said first circuit comprises an arithmetic logic unit configured to process a data frame through a plurality of parallel processing units and (ii) said processing units are controlled by said instructions.

7. The apparatus according to claim 6, wherein each of said processing units comprises a single instruction multiple data unit configured to (i) generate a sum value by adding two input values and (ii) generate an output value by integer division of said sum value by a modulo value.

8. The apparatus according to claim 3, wherein said first circuit is further configured to route information internally as controlled by said instructions.

9. The apparatus according to claim 1, wherein said first circuit is further configured to discard said indices greater than said code word size.

10. The apparatus according to claim 1, wherein said wireless communication standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

11. A method for computing one or more tables for multiple wireless communication standards, comprising the steps of:
(A) generating a control signal in response to a received signal, wherein said control signal identifies a current one of said wireless communication standards and a code word size;
(B) receiving said control signal at a circuit;
(C) generating said tables corresponding to both said current wireless communication standard and said code word size, wherein (i) each of said tables has a plurality of indices, (ii) two of said indices in at least one of said tables are generated per clock cycle and (iii) each of said tables comprises a permutation table of an interleaver;
(C) asserting a given signal in response to said indices being available; and
(D) storing said tables in a memory in response to said asserting of said given signal.

12. The method according to claim 11, further comprising the step of:
interleaving in another circuit an input signal per a turbo code according to at least one of said tables.

13. The method according to claim 11, further comprising the step of:
generating in a microsequencer of said circuit a plurality of program instructions based on both said current wireless communication standard and said code word size.

14. The method according to claim 13, wherein (i) said tables are generated based on a data frame received by said microsequencer and (ii) said generation of said tables is controlled by said instructions.

15. The method according to claim 13, further comprising the step of:
controlling each length of a plurality of variable length register rings with said instructions.

16. The method according to claim 13, further comprising the steps of:
processing a data frame through a plurality of parallel processing units; and
controlling said processing units with said instructions.

17. The method according to claim 16, wherein each of said processing units comprises a single instruction multiple data unit configured to (i) generate a sum value by adding two input values and (ii) generate an output value by integer division of said sum value by a modulo value.

18. The method according to claim 13, further comprising the step of:
   routing information internal to said circuit as controlled by said instructions.

19. The method according to claim 11, further comprising the step of:
   discarding said indices greater than said code word size.

20. An apparatus comprising:
   means for detecting configured to generate a control signal in response to a received signal, wherein said control signal identifies a current one of a plurality of wireless communication standards and a code word size;
   means for receiving said control signal;
   means for generating one or more tables corresponding to both said current wireless communication standard and said code word size, wherein (i) each of said tables has a plurality of indices, (ii) two of said indices in at least one of said tables are generated per clock cycle and (iii) each of said tables comprises a permutation table of an interleaver;
   means for asserting a given signal in response to said indices being available; and
   means for storing said tables in response to said asserting of said given signal.

* * * * *